US012678857B2

(12) United States Patent
Nakamura et al.

(10) Patent No.: US 12,678,857 B2
(45) Date of Patent: Jul. 14, 2026

(54) METHOD FOR MANUFACTURING RARE EARTH MAGNET

(71) Applicant: SHIN-ETSU CHEMICAL CO., LTD., Tokyo (JP)

(72) Inventors: Hajime Nakamura, Echizen (JP); Koichi Hirota, Echizen (JP); Tetsuya Ohashi, Fukui (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 995 days.

(21) Appl. No.: 17/641,251

(22) PCT Filed: Aug. 27, 2020

(86) PCT No.: PCT/JP2020/032414
§ 371 (c)(1),
(2) Date: Mar. 8, 2022

(87) PCT Pub. No.: WO2021/054077
PCT Pub. Date: Mar. 25, 2021

(65) Prior Publication Data
US 2022/0344080 A1      Oct. 27, 2022

(30) Foreign Application Priority Data

Sep. 20, 2019    (JP) ................................. 2019-171187

(51) Int. Cl.
*C23C 14/06*        (2006.01)
*B22F 1/05*        (2022.01)
(Continued)

(52) U.S. Cl.
CPC .............. *B22F 1/05* (2022.01); *C23C 14/067* (2013.01); *C23C 14/3414* (2013.01); *C23C 14/50* (2013.01); *H01F 1/057* (2013.01)

(58) Field of Classification Search
CPC .... C23C 14/50; C23C 16/4587; C23C 14/505
(Continued)

(56) References Cited

U.S. PATENT DOCUMENTS 4,558,388 A * 12/1985 Graves, Jr. .............. C23C 14/50
118/724
6,228,429 B1 * 5/2001 Bluck .................... B05D 3/145
118/503
(Continued)

FOREIGN PATENT DOCUMENTS

| CN | 101006534 A | 7/2007 |
| CN | 101952914 A | 1/2011 |

(Continued)

OTHER PUBLICATIONS

Machine translation to Li (CN 106 282 948 A) published Jan. 2017.*
(Continued)

*Primary Examiner* — John J Brayton
(74) *Attorney, Agent, or Firm* — Oblon, McClelland, Maier & Neustadt, L.L.P.

(57)        ABSTRACT
According to the present invention, a method for manufacturing a rare earth magnet that is capable of manufacturing a high-performance rare earth magnet with stable quality in large amount by the grain boundary diffusion method utilizing a film formed by the physical vapor phase deposition method is provided.

11 Claims, 9 Drawing Sheets

(51) Int. Cl.
  C23C 14/34 (2006.01)
  C23C 14/50 (2006.01)
  H01F 1/057 (2006.01)
(58) Field of Classification Search
  USPC ................................................ 118/500, 728
  See application file for complete search history.

(56) References Cited

U.S. PATENT DOCUMENTS

| | | | | |
|---|---|---|---|---|
| 6,843,892 B1 * | 1/2005 | McLeod | ................. | C23C 14/50 |
| | | | | 156/345.31 |
| 2006/0154111 A1 * | 7/2006 | Horigome | ............. | C23C 14/345 |
| | | | | 204/192.2 |
| 2018/0108560 A1 * | 4/2018 | Boughton | ......... | H01L 21/68735 |

FOREIGN PATENT DOCUMENTS

| | | | |
|---|---|---|---|
| CN | 105755441 A | | 7/2016 |
| CN | 106282948 A | * | 1/2017 |
| CN | 107533909 A | | 1/2018 |
| JP | 2004-304038 A | | 10/2004 |
| JP | 2008-263223 A | | 10/2008 |
| JP | 2009-43776 A | | 2/2009 |
| JP | 2009-54754 A | | 3/2009 |
| JP | 2009-194262 A | | 8/2009 |
| JP | 2010-135529 A | | 6/2010 |
| JP | 2011-204965 A | | 10/2011 |
| JP | 2012-109369 A | | 6/2012 |
| WO | WO 2006/043448 A1 | | 4/2006 |
| WO | WO 2008/023731 A1 | | 2/2008 |
| WO | WO 2008/032426 A1 | | 3/2008 |
| WO | WO 2008/120784 A1 | | 10/2008 |
| WO | WO 2018/138841 A1 | | 8/2018 |

OTHER PUBLICATIONS

Extended European Search Report issued on Sep. 13, 2023 in European Patent Application No. 20864703.2, 10 pages.

Korean Office Action issued Jul. 1, 2024 in Korean Patent Application No. 10-2022-7003810, 7 pages.

Japanese Office Action issued Jul. 5, 2022 in Japanese Patent Application No. 2019-171187, 4 pages.

Combined Chinese Office Action and Search Report issued Mar. 29, 2024 in Chinese Patent Application No. 202080065139.8, received on Apr. 19, 2024, 7 pages.

International Search Report issued Nov. 24, 2020 in PCT/JP2020/032414 filed Aug. 27, 2020, 2 pages.

K.T. Park, et al., "Effect of Metal-Coating and Consecutive Heat Treatment on Coercivity of Thin Nd—Fe—B Sintered Magnets", Proceedings of the Sixteenth International Workshop on Rare-Earth Magnets and Their Applications, The Japan Institute of Metals, 2000, pp. 257-264.

* cited by examiner

Horizontal Direction

⊙ Vertical Direction

Vertical Direction

Horizontal Direction

Vertical Direction

Horizontal Direction

Vertical Direction

Horizontal Direction

6

A

7

18

15, 16

17

A'

Vertical Direction

Horizontal Direction

Horizontal Direction

Vertical Direction

Vertical Direction

Horizontal Direction

Vertical Direction

Horizontal Direction

Horizontal Direction

Vertical Direction

METHOD FOR MANUFACTURING RARE EARTH MAGNET

TECHNICAL FIELD

The present invention relates to a method for manufacturing a rare earth magnet that is capable of drastically enhancing the productivity of the manufacturing process of a high-performance magnet using a less amount of Tb or Dy, in which a rare earth metal film or a rare earth alloy film is formed on a surface of a rare earth based sintered article, and heat-treated so that the rare earth element in the film is absorbed by the sintered article.

BACKGROUND ART

A rare earth permanent magnet, such as a Nd—Fe—B based sintered magnet, has expanded applications due to the excellent magnetic characteristics thereof, and the major applications thereof include a rotating machine. A rare earth permanent magnet having heat resistance against a temperature of 100 to 200° C. is required for the applications. Accordingly, a Nd—Fe—B based sintered magnet necessarily has a sufficiently increased coercive force at room temperature. A method of replacing a part of Nd by Tb or Dy has been employed for the enhancement of the coercive force. However, these elements have a performance problem that the saturation magnetic polarization is lowered and a resource problem that these elements are scarce elements, and thus these problems have hindered the expansion of the applications of the Nd—Fe—B based sintered magnet.

Under the circumstances, a method capable of largely increasing the coercive force with substantially no decrease in saturation magnetic polarization has been developed, in such a manner that Tb or Dy is disposed on the surface of the produced sintered article, which is then heat-treated at the sintering temperature or lower to diffuse Tb or Dy into the magnet, and thereby a slight amount of Tb or Dy is distributed on the crystal particle surface of the magnet. In the period right after finding the phenomenon, a sputtering method is used for disposing Dy on the magnet surface (see NPL 1). However, the method is not considered as a mass manufacturing process due to the low production efficiency thereof. After that, a three-dimensional sputtering method has been developed in which a sintered article is disposed inside a rotatable cage to enable film formation on the entire surface of the magnet (see PTL 1). However, there is a limitation in size and shape of the sintered article to be treated, failing to achieve mass production thereby. Under the circumstances, a method of dip-coating a slurry of rare earth compound powder, such as a rare earth oxide, a rare earth fluoride, or a rare earth oxyfluoride, on the sintered article has been developed (see PTL 2), and has been first subjected to the mass production process due to the high productivity thereof. In addition, a method using vapor of Dy (see PTLs 3 and 4), a method of adhering powder of a rare earth compound, a rare earth metal, a rare earth alloy, or a rare earth hydride, to the surface of the magnet (see PTLs 5 and 6), and the like have been developed. These methods, which are referred to as grain boundary diffusion methods, have been widely applied to the manufacturing method of a Nd—Fe—B based sintered magnet having high performance and high heat resistance.

Among these, the film produced by the sputtering method, which has been first found, can be controlled for the thickness thereof highly precisely, and furthermore the magnet manufactured by diffusing the film has higher performance than the other methods. Nevertheless, the sputtering method is difficult to apply to mass production due to the seriously low productivity thereof.

A magnet article used in an electric rotating machine, which is the largest application of the rare earth magnet, frequently has a flat and nearly plate shape with the widest surfaces as the magnetic pole faces, which is preferred from the standpoint of the effective utilization of the magnet performance. The three-dimensional sputtering device described in PTL 1 is expected to achieve high productivity in the point that a cage having disposed therein a magnet article having a flat and nearly plate shape is rotated, and thereby the film is formed on the entire surface of the magnet in one process. However, for the shape of the magnet article for an electric rotating machine, the sintered article cannot be uniformly rotated in the cage, and the film tends to have unevenness, which negates the advantage of the use of the sputtering method.

A large effect of enhancing the coercive force can be obtained for such a shape by forming and diffusing a film containing a rare earth element only on two surfaces, i.e., the widest surfaces of the sintered article, but not on the entire surface thereof. With the ordinary sputtering device, it is preferred for enhancing the workability that the target is disposed in the upper part of the sputtering chamber, plural sintered articles are disposed on a tray having an area or a width that is substantially the same as the target, and the tray is disposed under the target.

With this configuration, however, the film can be formed only on one surface of the two wide surfaces of the sintered article. Accordingly, it is necessary that after forming the film on one surface of the sintered article, the sintered article on the tray is securely reversed, and then again placed in the sputtering chamber for forming the film on the remaining one surface. For reversing the sintered article, an automatic reversing mechanism reversing the sintered article along with the tray occupies a large space. A manual work for reversing saves space, but increases the risk of quality problem caused by forgetting to reverse the sintered article.

CITATION LIST

Patent Literatures

PTL 1: JP 2004-304038 A
PTL 2: WO 2006/043448
PTL 3: WO 2008/023731
PTL 4: JP 2008-263223 A
PTL 5: WO 2008/120784
PTL 6: WO 2008/032426

Non-Patent Literature

NPL 1: K. T. Park, K. Hiraga and M, Sagawa, "Effect of Metal-Coating and Consecutive Heat Treatment on Coercivity of Thin Nd—Fe—B Sintered Magnets", Proceedings of the Sixteenth International Workshop on Rare-Earth Magnets and Their Applications, Sendai, p. 257 (2000)

SUMMARY OF INVENTION

Technical Problem

The present invention has been made in view of the aforementioned circumstances, and an object thereof is to provide a manufacturing method having high productivity for the so-called grain boundary diffusion method, i.e., a method for manufacturing a rare earth magnet by forming a film on a surface of a sintered article formed of an $R^1$—Fe—B based composition (wherein $R^1$ represents one kind or two or more kinds of an element selected from rare earth elements, and is required to be one kind or two kinds of Pr and Nd) by a physical vapor phase deposition method, then allowing $R^2$ (wherein $R^2$ represents one kind or two or more kinds of an element selected from rare earth elements, and is required to be one kind or two kinds of Tb and Dy) to be absorbed by the sintered article through a heat treatment.

Solution to Problem

As a result of the earnest investigations by the present inventors for achieving the object, it has been found that a high productivity manufacturing method capable of forming films containing $R^2$ on two opposing surfaces of a sintered article by one time input can be achieved by providing plural film forming treatment chambers juxtaposed with each other each having a target, which has been conventionally disposed only on the upper side, and sintered articles that are disposed vertically or horizontally, and thus the present invention has been completed.

(1) A method for manufacturing a rare earth magnet, including a grain boundary diffusion process including: forming one kind or two or more kinds of a film selected from an $R^2$ film, an $R^2$-M alloy film, and a multilayer film of $R^2$ and M (wherein $R^2$ represents one kind or two or more kinds of an element selected from rare earth elements, and is required to be one kind or two kinds of Tb and Dy, and M represents one kind or two or more kinds of an element selected from the group consisting of Cu, Al, Co, Fe, Mn, Ni, Sn, and Si) by a physical vapor phase deposition method, on plural sintered articles each having a first surface and a second surface on an opposite side to the first surface, each containing an $R^1$—Fe—B based composition (wherein $R^1$ represents one kind or two or more kinds of an element selected from rare earth elements, and is required to be one kind or two kinds of Pr and Nd); and then allowing $R^2$ or $R^2$ and M to be absorbed by the sintered articles through a heat treatment, the plural sintered articles being disposed side by side with a jig in such a manner that the first surfaces of the plural sintered articles are along a plane in parallel to a vertical direction or a horizontal direction, the grain boundary diffusion process including: a first film forming step of forming the film on the first surface of the plural sintered articles disposed side by side with the jig in an inert gas atmosphere, in a first film forming treatment chamber having provided therein a target containing $R^2$ provided by disposing on a side of the first surfaces of the plural sintered articles; a second film forming step of forming the film on the second surface of the plural sintered articles disposed side by side with the jig in an inert gas atmosphere, in a second film forming treatment chamber, which is juxtaposed with the first film forming treatment chamber, having provided therein a target containing $R^2$ provided by disposing on a side of the second surfaces of the plural sintered articles; and a moving step of moving the plural sintered articles disposed side by side with the jig in a horizontal direction or a vertical direction between the first film forming treatment chamber and the second film forming treatment chamber.

(2) The method for manufacturing a rare earth magnet according to the item (1), wherein the plural first film forming treatment chambers and the plural second film forming treatment chambers each are disposed in series, and the film is continuously formed in an inert gas atmosphere without exposing the plural sintered articles to the air.

(3) A method for manufacturing a rare earth magnet, including a grain boundary diffusion process including: forming one kind or two or more kinds of a film selected from an $R^2$ film, an $R^2$-M alloy film, and a multilayer film of $R^2$ and M (wherein $R^2$ represents one kind or two or more kinds of an element selected from rare earth elements, and is required to be one kind or two kinds of Tb and Dy, and M represents one kind or two or more kinds of an element selected from the group consisting of Cu, Al, Co, Fe, Mn, Ni, Sn, and Si) by a physical vapor phase deposition method, on plural sintered articles each having a first surface and a second surface on an opposite side to the first surface, each containing an $R^1$—Fe—B based composition (wherein $R^1$ represents one kind or two or more kinds of an element selected from rare earth elements, and is required to be one kind or two kinds of Pr and Nd); and then allowing $R^2$ or $R^2$ and M to be absorbed by the sintered articles through a heat treatment, the plural sintered articles being disposed side by side with a jig in such a manner that the first surfaces of the plural sintered articles are along a plane in parallel to a vertical direction or a horizontal direction, the grain boundary diffusion process including: forming the film simultaneously on the first surface and the second surface of the plural sintered articles disposed side by side with the jig in an inert gas atmosphere, in a duplex film forming treatment chamber having provided therein a target containing $R^2$ provided by disposing on a side of the first surfaces of the plural sintered articles and a target containing $R^2$ provided by disposing on a side of the second surfaces of the plural sintered articles.

(4) The method for manufacturing a rare earth magnet according to the item (3), wherein the plural duplex film forming treatment chambers are disposed in series, and the film is continuously formed in an inert gas atmosphere without exposing the plural sintered articles to the air.

(5) The method for manufacturing a rare earth magnet according to any one of the items (1) to (4), wherein the jig contains one kind or two or more kinds of a material selected from the group consisting of aluminum, an aluminum alloy, copper, a copper alloy, iron, an iron alloy, titanium, a titanium alloy, niobium, a niobium alloy, tungsten, a tungsten alloy, molybdenum, and a molybdenum alloy; the jig has a holding part formed to have sharp points, between which the sintered article is held; and the points of the holding part each have a moving distance within elastic limit that is twice or more a dimensional tolerance range of a dimension of the sintered article in a holding direction.

(6) The method for manufacturing a rare earth magnet according to any one of claims 1 to 5, wherein the holding part is coated with one kind or two or more kinds of a material selected from an organic material and ceramics, except for a contact point to the sintered article and an electric connecting point for grounding.

(7) The method for manufacturing a rare earth magnet according to any one of the items (1) to (6), wherein the grain boundary diffusion process includes one kind or two or more kinds of a step selected from the group consisting of: an atmosphere vacuuming step of vacuuming an atmosphere of the plural sintered articles in a preparation chamber, before placing the plural sintered articles in the film forming treatment chamber; an adsorbed gas elimination step of eliminating an adsorbed gas from the plural sintered articles in a baking treatment chamber, before placing the plural sintered articles in the film forming treatment chamber; a surface cleaning step of cleaning the surfaces of the plural sintered articles in a reverse sputtering chamber, before placing the plural sintered articles in the film forming treatment chamber; a heat treatment step of heat-treating the plural sintered articles in a heat treatment chamber, after forming the film on the surfaces of the plural sintered articles; a cooling step of cooling the plural sintered articles in a cooling chamber after the heat treatment; and an air release step of allowing an atmosphere of the plural sintered articles to be an atmospheric pressure, for releasing the plural sintered articles to air in a delivery chamber, and the film forming treatment chamber is continuously connected to one or two or more of a chamber selected from the group consisting of the preparation chamber, the baking treatment chamber, the heat treatment chamber, the cooling chamber, and the delivery chamber.

(8) The method for manufacturing a rare earth magnet according to any one of the items (1) to (7), wherein the grain boundary diffusion process includes, after forming the film and before the heat treatment, a weld suppressing step of forming a film of one kind or two or more kinds of a compound selected from an oxide, a fluoride, and a oxyfluoride of $R^3$ (wherein $R^3$ represents one kind or two or more kinds of an element selected from rare earth elements) by a physical vapor phase deposition method, on one surface or both surfaces of the first surface and the second surface of the plural sintered articles disposed side by side with the jig, and the weld suppressing step includes forming a film of the compound on one surface or both surfaces of the first surface and the second surface of the plural sintered articles disposed side by side with the jig in one kind or two or more kinds of a gas atmosphere selected from the group consisting of argon, oxygen, and nitrogen, in a weld suppressing treatment chamber having provided therein one target or both targets of a target containing one kind or two or more kinds of a material selected from the group consisting of a metal of the $R^3$, an alloy of the $R^3$, an oxide of the $R^3$, a fluoride of the $R^3$, and an oxyfluoride of the $R^3$, disposed on a side of the first surfaces of the plural sintered articles, and a target containing one kind or two or more kinds of a material selected from the group consisting of a metal of the $R^3$, an alloy of the $R^3$, an oxide of the $R^3$, a fluoride of the $R^3$, and an oxyfluoride of the $R^3$, disposed on a side of the second surfaces of the plural sintered articles.

(9) The method for manufacturing a rare earth magnet according to the item (8), wherein the weld suppressing step includes a first weld suppressing step of forming a film of the compound by a physical vapor phase deposition method, on the first surface of the plural sintered articles disposed side by side with the jig, in a first weld suppressing treatment chamber having provided therein the target disposed on a side of the first surfaces of the plural sintered articles, and a second weld suppressing step of forming a film of the compound by a physical vapor phase deposition method, on the second surface of the plural sintered articles disposed side by side with the jig, in a second weld suppressing treatment chamber having provided therein the target disposed on a side of the second surfaces of the plural sintered articles.

(10) The method for manufacturing a rare earth magnet according to the item (8), wherein the weld suppressing step includes forming a film of the compound by a physical vapor phase deposition method, simultaneously on the first surface and the second surface of the plural sintered articles disposed side by side with the jig, in a duplex weld suppressing treatment chamber having provided therein the target disposed on a side of the first surfaces of the plural sintered articles and the target disposed on a side of the second surfaces of the plural sintered articles.

(11) The method for manufacturing a rare earth magnet according to any one of the items (1) to (7), wherein the physical vapor phase deposition method is a sputtering method.

(12) The method for manufacturing a rare earth magnet according to any one of the items (8) to (10), wherein the physical vapor phase deposition method in the weld suppressing step is an RF sputtering method.

Advantageous Effects of Invention

According to the present invention, a high-performance rare earth magnet having a stable quality can be mass-manufactured by the grain boundary diffusion method utilizing the film formed by the physical vapor phase deposition method.

DESCRIPTION OF EMBODIMENTS

Figure 1:
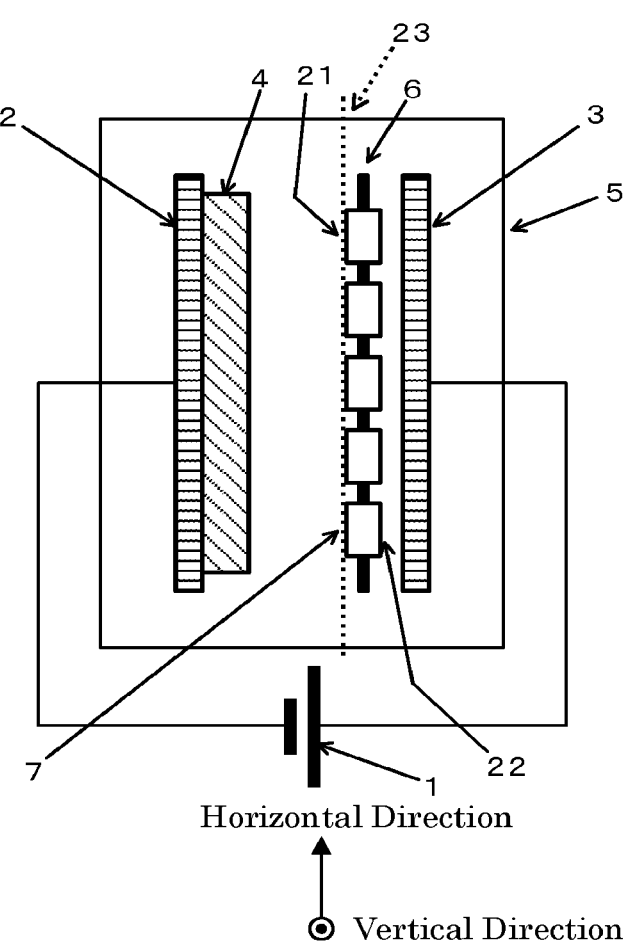
FIG. 1 is a schematic view showing the first film forming treatment chamber viewed from the upper side in the vertical direction used in the method for manufacturing a rare earth magnet in the case of the horizontal configuration according to one embodiment of the present invention.

The present invention will be described in detail below.

The present invention relates to a method for manufacturing a rare earth magnet having high performance and a small amount of Tb or Dy used. A method for manufacturing a rare earth magnet according to one embodiment of the present invention includes a grain boundary diffusion process including: forming one kind or two or more kinds of a film selected from an $R^2$ film, an $R^2$-M alloy film, and a multilayer film of $R^2$ and M (wherein $R^2$ represents one kind or two or more kinds of an element selected from rare earth elements, and is required to be one kind or two kinds of Tb and Dy, and M represents one kind or two or more kinds of an element selected from the group consisting of Cu, Al, Co, Fe, Mn, Ni, Sn, and Si) by a physical vapor phase deposition method, on plural sintered articles each having the first surface and the second surface on the opposite side to the first surface, each containing an $R^1$—Fe—B based composition (wherein $R^1$ represents one kind or two or more kinds of an element selected from rare earth elements, and is required to be one kind or two kinds of Pr and Nd); and then allowing $R^2$ or $R^2$ and M to be absorbed by the sintered articles through a heat treatment. The sintered article can be obtained by coarsely pulverizing, finely pulverizing, molding, and sintering a mother alloy according to the ordinary method.

In this case, the mother alloy contains $R^1$, T, Q, and B. $R^1$ represents one kind or two or more kinds of an element selected from rare earth elements, and is required to be one kind or two kinds of Pr and Nd. Specific examples of the rare earth elements include Sc, Y, La, Ce, Pr, Nd, Sm, Eu, Gd, Tb, Dy, Ho, Er, Yb, and Lu, and $R^1$ contains one kind or two kinds of Pr and Nd as a major component. It is preferred that $R^1$ is 12 to 17% by atom, and particularly 13 to 17% by atom, based on the total of the alloy, and it is more preferred that $R^1$ contains 80% by atom or more, and particularly 85% by atom or more of Pr and Nd or any one kind thereof, based on the total of $R^1$. T represents Fe, or Fe and Co. In the case where T represents Fe and Co, it is preferred that Fe is contained in an amount of 85% by atom or more, and particularly 90% by atom or more, in T. Q may contain one kind or two or more kinds of an element selected from the group consisting of Al, Si, Cu, Zn, In, P, S, Ti, V, Cr, Mn, Ni, Ga, Ge, Zr, Nb, Mo, Pd, Ag, Cd, Sn, Sb, Hf, Ta, and W in an amount of 0 to 10% by atom, and particularly 0.05 to 4% by atom. It is preferred that B is contained in an amount of 5 to 10% by atom, particularly 5 to 7% by atom, based on the total of the alloy. The balance thereof is unavoidable impurities, such as C, N, O, and F.

The mother alloy can be obtained in such a manner that raw material metals or alloys are melted in a vacuum or in an inert gas atmosphere, preferably an Ar atmosphere, and then cast into a flat mold or a book mold or cast by strip casting. A so-called double alloy method may also be applied in which an alloy close to the $R^1_2Fe_{14}B$ chemical composition, which is the main phase of the mother alloy, and an $R^1$-rich or $R^2$-rich alloy functioning as a liquid phase aid at the sintering temperature are prepared separately, and after coarsely pulverizing, are weighed and mixed.

However, α-Fe as primary crystals tends to remain in the mother alloy depending on the cooling rate in casting and the alloy composition, as compared to the alloy close to the main phase composition. Accordingly, a homogenization treatment may be performed for the purpose of increasing the amount of the $R^1_2Fe_{14}B$ chemical composition phase. For example, the mother alloy may be subjected to a heat treatment at a heat treatment temperature of 700 to 1,200° C. in vacuum or in an Ar atmosphere for 1 hour or more. The $R^1$-rich or $R^2$-rich alloy functioning as a liquid phase aid may also be prepared by a so-called liquid quenching method, in addition to the aforementioned casting method.

The mother alloy is coarsely pulverized generally to 0.05 to 3 mm, and particularly 0.05 to 1.5 mm. The coarsely pulverizing step may be performed with a Braun mill or by hydrogen pulverization, and the mother alloy that is prepared strip casting is preferably pulverized by hydrogen pulverization. The coarse powder is finely pulverized generally to 0.1 to 30 μm, and particularly 0.2 to 20 μm.

The resulting fine powder is molded into a green compact in a magnetic field with a compression molding machine, and then placed in a sintering furnace. The sintering is performed in vacuum or in an inert gas atmosphere at a sintering temperature of generally 900 to 1,250° C., and particularly 1,000 to 1,100° C. The resulting sintered article contains a tetragonal $R^1_2Fe_{14}B$ compound as the main phase in an amount of 60 to 99% by volume, and particularly preferably 80 to 98% by volume. The balance includes 0.5 to 20% by volume of an $R^1$-rich phase (containing 25% by atom or more of $R^1$), 0 to 10% by volume of a B-rich phase, and 0.1 to 10% by volume of a phase containing one kind or two or more kinds of a compound selected from the group consisting of an oxide of $R^1$ and a carbide, a nitride, a hydroxide, and a fluoride formed from the unavoidable impurities, and a mixture or a composite thereof.

The resulting sintered article is ground to a prescribed shape depending on necessity, and then subjected to the grain boundary diffusion process including forming one kind or two or more kinds of a film selected from an $R^2$ film, an $R^2$-M alloy film, and a multilayer film of $R^2$ and M (wherein $R^2$ represents one kind or two or more kinds of an element selected from rare earth elements, and is required to be one kind or two kinds of Tb and Dy, and M represents one kind or two or more kinds of an element selected from the group consisting of Cu, Al, Co, Fe, Mn, Ni, Sn, and Si) by a physical vapor phase deposition (PVD) method, on the surface of the sintered article, and then allowing $R^2$ or $R^2$ and M to be absorbed by the sintered articles through a heat treatment. The shape of the sintered article is preferably a plate shape. It is also possible that $R^2$ and M are separately formed into films to form a multilayer film, or $R^2$ and M are simultaneously formed into a film, at which $R^2$ and M are alloyed.

The size of the sintered article is not particularly limited. However, the amount of $R^2$ absorbed by the sintered article in the grain boundary diffusion process is larger when the specific surface area of the sintered article is larger, i.e., the size thereof is smaller, assuming the constant thickness for the $R^2$ film, the $R^2$-M alloy film, or the multilayer film of $R^2$ and M. Accordingly, the dimension of the minimum part of the shape of the sintered article is preferably 30 mm or less, and more preferably 15 mm or less, from the standpoint of the extent of the coercive force finally obtained, i.e., the heat resistance. The lower limit of the dimension of the minimum part is not particularly limited and may be appropriately selected, and the dimension of the minimum part of the shape is preferably 0.5 mm or more.

In the grain boundary diffusion process, as the first step, one kind or two or more kinds of a film selected from an $R^2$ film, an $R^2$-M alloy film, and a multilayer film of $R^2$ and M is formed on the surface of the sintered article by a PVD method. A sputtering method will be described herein as a representative example of the PVD method.

Figure 2:
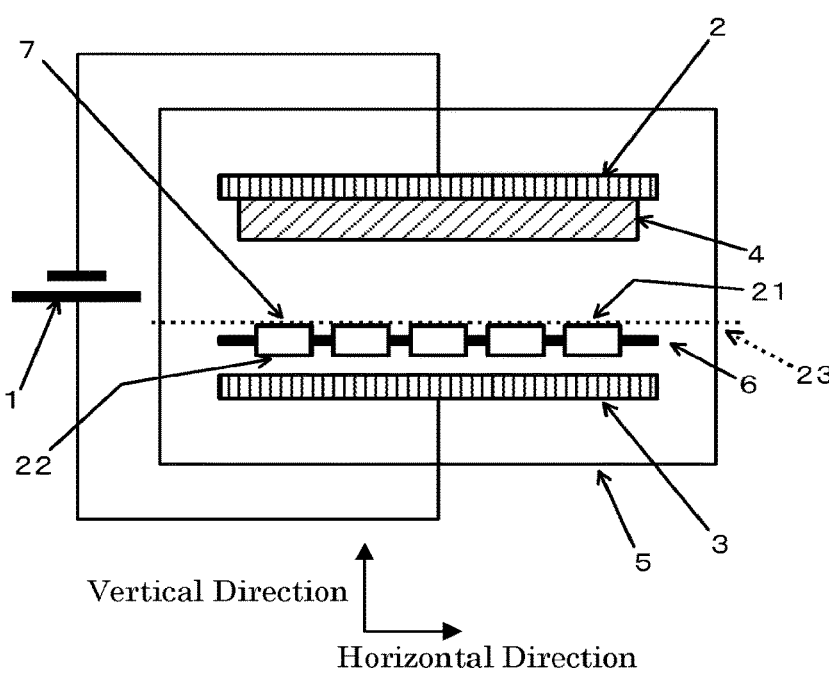
FIG. 2 is a schematic view showing the first film forming treatment chamber viewed from the lateral side in the horizontal direction used in the method for manufacturing a rare earth magnet in the case of the vertical configuration according to one embodiment of the present invention.
Figure 5:
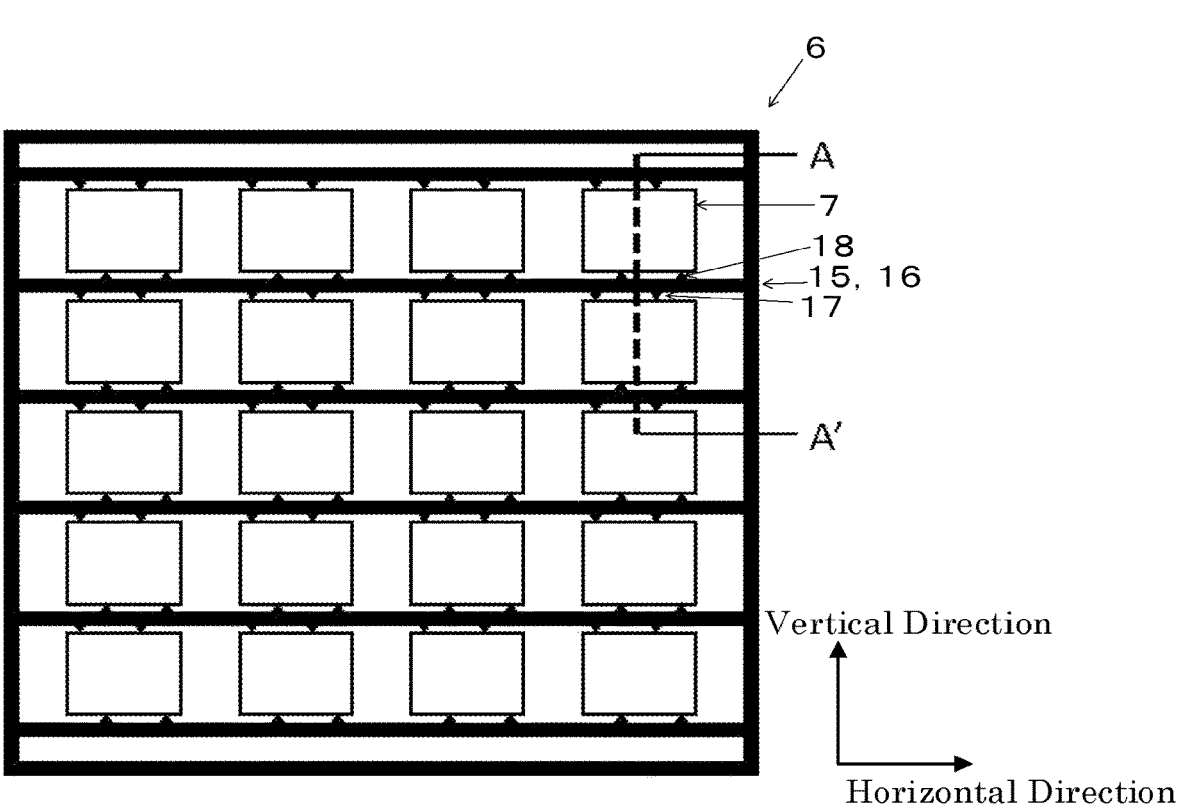
FIG. 5 is a schematic view showing the sintered article supporting jig having the sintered articles disposed therein used in the method for manufacturing a rare earth magnet in the case of the horizontal configuration according to one embodiment of the present invention.
Figure 6:
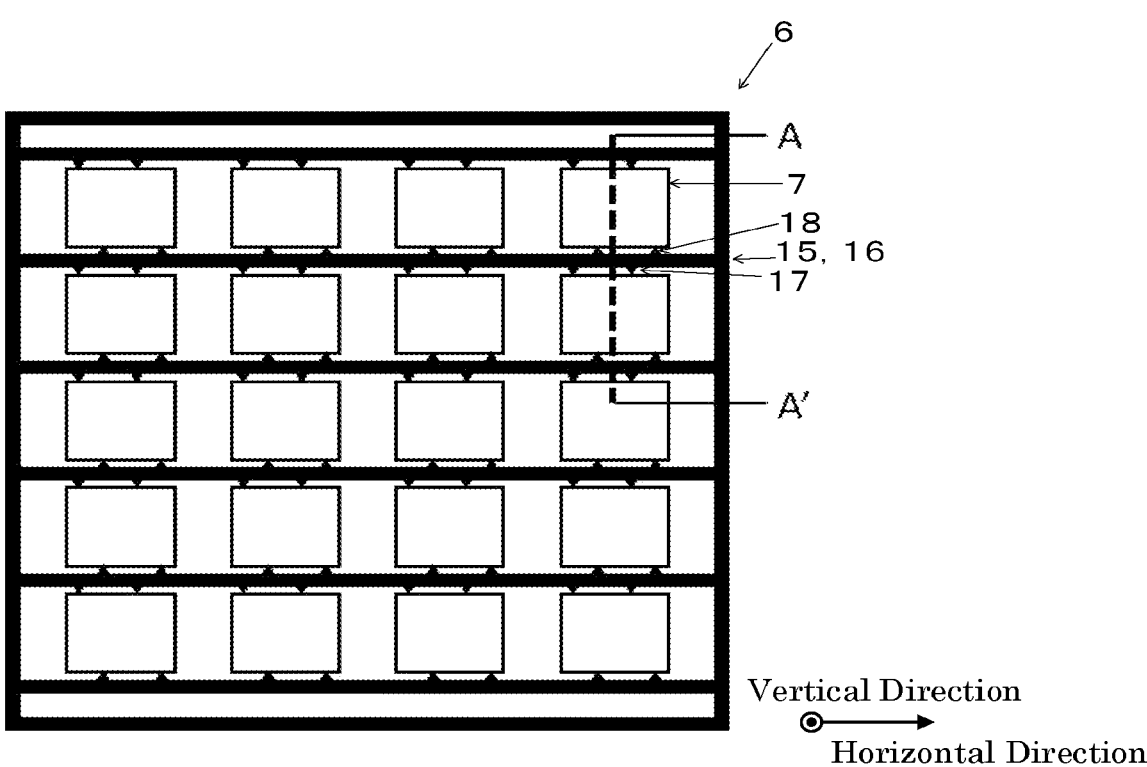
FIG. 6 is a schematic view showing the sintered article supporting jig having the sintered articles disposed therein used in the method for manufacturing a rare earth magnet in the case of the vertical configuration according to one embodiment of the present invention.

In a manufacturing method according to one embodiment of the present invention, for example, in the case where the target and the sintered articles are disposed in such a manner that the first surfaces of the sintered articles are in parallel to the vertical plane, as for the plural sintered articles 7 each having the first surface 21 and the second surface 22, which is opposite to the first surface 21, the plural sintered articles 7 are disposed side by side with a sintered article supporting jig 6 along a plane 23 in parallel to the first surfaces 21 of the plural sintered articles 7, as shown in FIGS. 1 and 5. On the other hand, in the case where the target and the sintered articles are disposed in such a manner that the first surfaces of the sintered articles are in parallel to the horizontal plane, as for the plural sintered articles 7 each having the first surface 21 and the second surface 22, which is opposite to the first surface 21, the plural sintered articles 7 are disposed side by side with a sintered article supporting jig 6 along a plane 23 in parallel to the first surfaces 21 of the plural sintered articles 7, as shown in FIGS. 2 and 6. In the ordinary techniques, since the target is disposed on the upper side in the vertical direction, and the sintered articles are placed on a tray disposed on the lower side of the target, the film can be formed only on the first surfaces 21 on the side of the target. However, the use of the sintered article supporting jig 6 enables the formation of the film on the second surfaces 22 opposite to the first surfaces 21. According to the configuration, plural sintered articles can be disposed side by side without placing on a tray. The case where the target and the sintered articles are disposed in such a manner that the first surfaces of the sintered articles are in parallel to the vertical plane as shown in FIG. 1 is hereinafter referred to as a horizontal configuration, and the case where the target and the sintered articles are disposed in such a manner that the first surfaces of the sintered articles are in parallel to the horizontal plane as shown in FIG. 2 is hereinafter referred to as a vertical configuration.

The plural sintered articles 7 disposed side by side with the sintered article supporting jig 6 are disposed in the first film forming treatment chamber 5 having provided therein the target 4 containing $R^2$, for example, the target 4 containing $R^2$, an $R^2$-M alloy, or $R^2$ and M, provided by disposing on the side of the first surfaces 21 of the plural sintered articles 7. A cathode 2 is provided on the opposite side to the sintered articles of the target 4. An anode 3 is provided on the opposite side to the target of the plural sintered articles 7. FIGS. 1 and 2 are schematic views of the first film forming treatment chambers 5 viewed from the upper side in the vertical direction and viewed from the lateral side in the horizontal direction, respectively. The target 4 containing $R^2$, an $R^2$-M alloy, or $R^2$ and M is constituted as a one target or plural targets depending on the size of one target. The target 4 is fixed to the cathode 2, for example, with a backing plate (which is not shown in the figures). In the case where the film is formed in an inert atmosphere without exposing to the air while continuously moving the plural sintered articles 7 disposed side by side with the sintered article supporting jig 6 in the traveling direction shown by the arrow in FIGS. 3 and 4, the plural sintered article supporting jigs 6 may be disposed side by side in series in the traveling direction of the sintered article supporting jigs 6. Although the target 4 is disposed to face the first surfaces 21 of the plural sintered articles 7, the configuration of the target is not particularly limited, as far as the target is disposed on the side of the first surfaces 21 of the plural sintered articles 7. For example, in an opposed target sputtering method, the target may be disposed not to face the first surfaces of the plural sintered articles. Although the target 4 has a plate shape, the shape of the target is not particularly limited. For example, in a magnetron sputtering method, a target having a cylindrical shape may be used.

Figure 3:
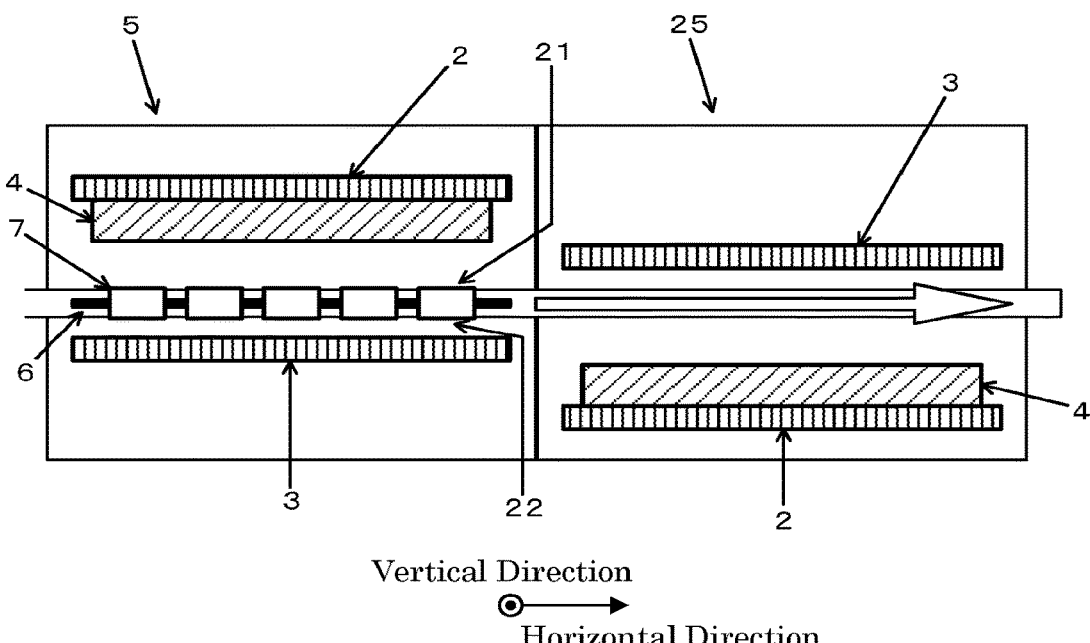
FIG. 3 is a schematic view showing the first film forming treatment chamber and the second film forming treatment chamber viewed from the upper side in the vertical direction used in the method for manufacturing a rare earth magnet in the case of the horizontal configuration according to one embodiment of the present invention.
Figure 4:
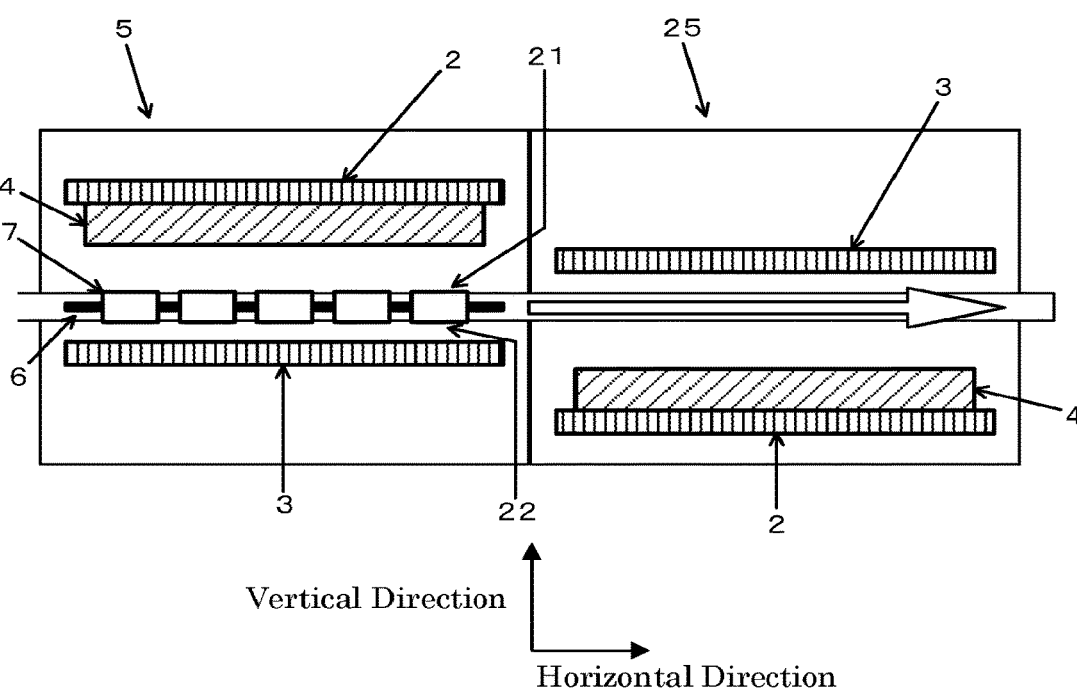
FIG. 4 is a schematic view showing the first film forming treatment chamber and the second film forming treatment chamber viewed from the lateral side in the horizontal direction used in the method for manufacturing a rare earth magnet in the case of the vertical configuration according to one embodiment of the present invention.
Figure 9:
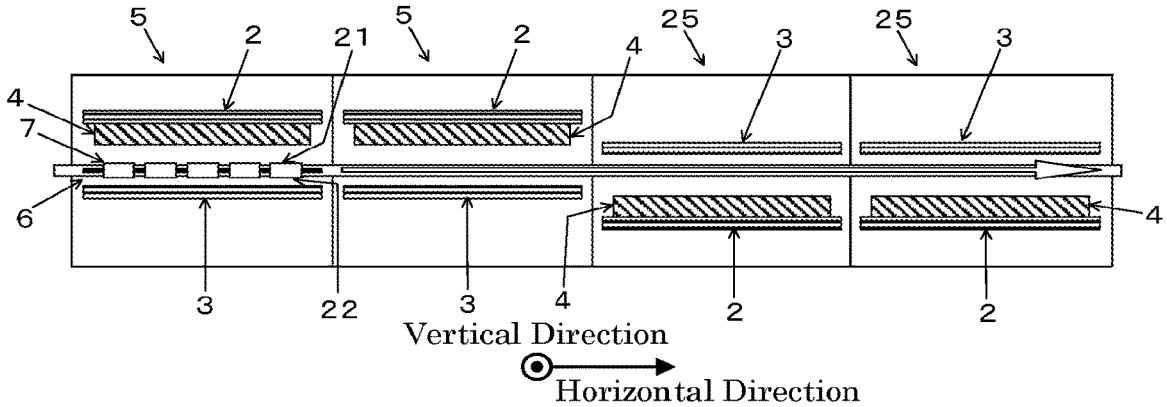
FIG. 9 is a schematic view showing a configuration example of the first film forming treatment chambers and the second film forming treatment chambers viewed from the upper side in the vertical direction used in the method for manufacturing a rare earth magnet in the case of the horizontal configuration according to one embodiment of the present invention.
Figure 10:
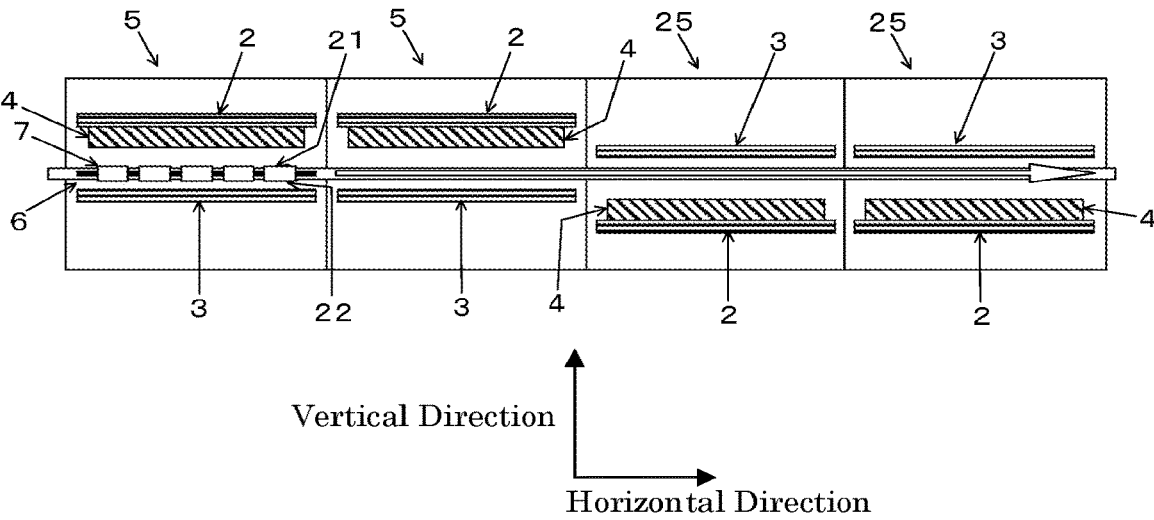
FIG. 10 is a schematic view showing a configuration example of the first film forming treatment chambers and the second film forming treatment chambers viewed from the lateral side in the horizontal direction used in the method for manufacturing a rare earth magnet in the case of the vertical configuration according to one embodiment of the present invention.

One kind or two or more kinds of a film selected from an $R^2$ film, an $R^2$-M alloy film, and a multilayer film of $R^2$ and M is formed on the first surfaces 21 of the sintered articles in the first film forming treatment chamber 5. Thereafter, as shown in FIGS. 3 and 4, the sintered article supporting jig 6 having the plural sintered articles 7 disposed therein is moved in the horizontal direction. The sintered article supporting jig 6 is then moved into the second film forming treatment chamber 25, which is juxtaposed with the first film forming treatment chamber 5, having provided therein the target 4 containing $R^2$ provided by disposing on the side of the second surfaces 22 opposite to the first surfaces 21. Thereafter, the film is formed on the second surfaces 22 of the sintered articles 7. The first film forming treatment chamber 5 and the second film forming treatment chamber 25 are continuously connected for preventing the sintered articles 7 from being into contact with the air, and plural chambers may be disposed for each of them depending on necessity as shown in FIGS. 9 and 10. In the case where the target and the sintered articles are in the horizontal configuration, it is possible that the second film forming treatment chamber is disposed in the vertical direction of the first film forming treatment chamber, and the sintered article supporting jig having the plural sintered articles disposed therein is moved in the vertical direction. According to the procedure, the film can be continuously formed in an inert gas atmosphere without exposing the plural sintered articles to the air. Although the target 4 is disposed to face the second surfaces 22 of the plural sintered articles 7, the configuration of the target is not particularly limited, as far as the target is disposed on the side of the second surfaces 22 of the plural sintered articles 7. For example, in an opposed target sputtering method, the target may be disposed not to face the second surfaces 21 of the plural sintered articles.

The sputtering method is performed in an inert gas atmosphere, preferably an argon atmosphere, of several pascals. An electric power source 1 used in the sputtering method is preferably a DC electric power source, and may be an RF electric power source or a combination thereof.

A preparation chamber is preferably provided before the film forming treatment chamber 5 for forming the film via a gate valve blocking the interior of the film forming treatment chamber from the air. The sintered article supporting jig 6 having the plural sintered articles 7 disposed therein is installed into the preparation chamber, and then after closing the gate valve, the interior thereof is vacuumed. After reaching high vacuum, an inert gas, preferably argon, is introduced to substitute the atmosphere in the chamber. A baking treatment chamber for eliminating water on the surface of the sintered articles and an adsorbed gas, such as oxygen, and a reverse sputtering chamber for cleaning the surfaces of the sintered articles through etching by sputtering the surfaces of the sintered articles with the sintered articles as the cathode may be provided before the film forming treatment chamber 5 for forming the film. These treatments may be performed in the preparation chamber by providing the treatment devices therefor in the preparation chamber.

The thickness of the film formed on the sintered articles 7 may be appropriately determined depending on the amount of $R^2$ to be absorbed by the sintered articles 7 (i.e., the target increment of the coercive force). The thickness of the film is typically 0.1 to 50 μm, preferably 0.5 to 20 μm, and more preferably 1 to 10 μm, from the standpoint of the achievement of the sufficient effect of enhancing the coercive force and the standpoint of the time required for the treatment, the productivity, and the resource saving.

One example of the sintered article supporting jig 6 is schematically shown in FIGS. 5 to 8. In the horizontal configuration, the plural sintered articles 7 are disposed side by side with the sintered article supporting jig 6 in such a manner that the first surfaces 21 of the plural sintered articles 7 are along the plane in parallel to the vertical direction as shown in FIG. 5. In the vertical configuration, on the other hand, the plural sintered articles 7 are disposed side by side with the sintered article supporting jig 6 in such a manner that the first surfaces 21 of the plural sintered articles 7 are in the plane in parallel to the horizontal direction as shown in FIG. 6. The sintered articles 7 each are retained by holding with a holding part having sharply formed points 17 and 18 provided in the sintered article supporting jig 6. Accordingly, it is necessary that the sintered article supporting jig 6 has a strength that is sufficient for the weight of the sintered articles and has an elastic deformation capability at the holding part. In this standpoint, the material of the sintered article supporting jig 6 is preferably, for example, one kind or two or more kinds of a material selected from the group consisting of aluminum, an aluminum alloy, copper, a copper alloy, iron, an iron alloy, titanium, a titanium alloy, niobium, a niobium alloy, tungsten, a tungsten alloy, molybdenum, and a molybdenum alloy.

In the case where the sintered article supporting jig 6 and the sintered articles 7 are used as the anode, it is necessary that electric connection is established between the sintered article supporting jig 6 and the sintered articles 7 particularly in the case where the duplex simultaneous film formation described later (see FIGS. 11 and 12) is applied. For securing the connection, the points 17 and 18 of the holding part are sharply formed. In the case where the sintered article supporting jig 6 and the sintered articles 7 are used as the anode, the points 17 and 18 of the holding part function as the contact point to the sintered article 7 and also an electric connecting point for grounding. The part of the sintered article supporting jig 6 except for the points 17 and 18 is preferably coated with one kind or two or more kinds of a material selected from an organic material, such as an epoxy resin, and ceramics, such as alumina, for suppressing the unnecessary film formation on the sintered article supporting jig by the sputtering method or for achieving a state where the part suffering the unnecessary film formation can be readily cleaned.

The holding part of the sintered article supporting jig 6 has an elastic deformation capability for allowing the points 17 and 18 to move vertically or horizontally for holding the sintered article 7. For sufficiently holding for the size of the sintered article 7 in the holding direction, it is necessary that the holding part undergoes elastic deformation within a range of the dimensional tolerance of the sintered article 7. For example, in the case where the tolerance range is 0.4 mm, the moving distance of the point due to elastic deformation may be designed to be approximately 0.4 mm. However, the sintered article supporting jig 6 of this configuration can be applied only to the sintered articles 7 having the same dimension and tolerance in the holding direction. Therefore, it is not rational since a huge variety of sintered article supporting jigs 6 are necessary for applying to rare earth magnet products finished to have various shapes and sizes.

Accordingly, it is effective to use the sintered article supporting jig 6 that is capable of being applied to the sintered articles 7 having a certain dimensional range without limitation in kind of the rare earth magnet products. In the present invention, the moving distance of the points 17 and 18 of the holding part within the elastic limit of the holding part may be twice or more the dimensional tolerance range of the sintered article 7 in the holding direction in consideration of the actual property values of the material and the design range of the sintered article supporting jig 6. The use of the sintered article supporting jig 6 of this type can largely reduce the kinds of the sintered article supporting jig 6 to be prepared. For example, with the use of the sintered article supporting jig 6 having a moving distance within the elastic limit of the holding part that is twice or more a dimensional tolerance range of 0.4 mm of the dimension of the sintered article 7 in the holding direction, the sintered articles 7 having a difference in dimension in the holding direction by 0.8 mm can be processed with one sintered article supporting jig 6.

Figure 7:
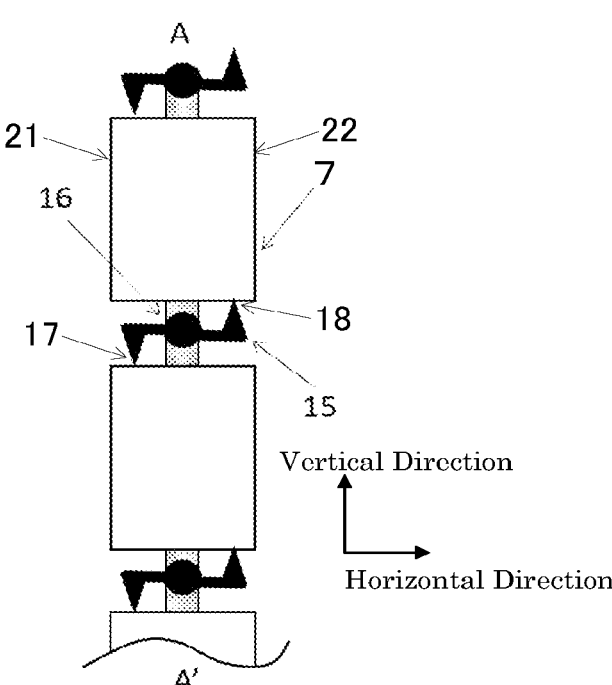
FIG. 7 is a cross sectional view showing the part A-A' of the sintered article supporting jig shown in FIG. 5.
Figure 8:
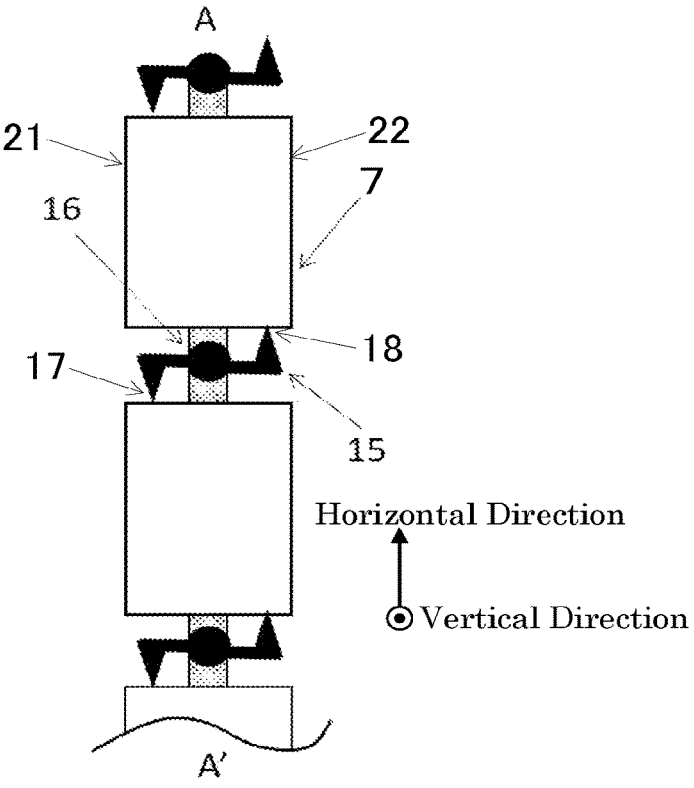
FIG. 8 is a cross sectional view showing the part A-A' of the sintered article supporting jig shown in FIG. 6.

The holding part of the sintered article supporting jig having an elastic deformation capability can have the configuration shown in FIG. 7 for the horizontal configuration, or can have the configuration shown in FIG. 8 for the vertical configuration. The beam 15 of the holding part is elastically deformed in such a manner that the point 17 of the holding part is moved upward, whereas the point 18 of the holding part is moved downward, with the lateral frame 16 as the center, and thereby the holding part can have a larger moving distance of the point with respect to the dimensional tolerance range of the sintered articles 7. According to the configuration, the kinds of the sintered article supporting jigs 6 to be prepared for the sintered articles 7 having various dimensional tolerance ranges can be reduced, and a large number of the sintered articles 7 can be held at one time. Accordingly, the film forming treatment can be efficiently performed. Furthermore, material and dimension achieving an elastic deformation may be selected for the lateral frame 16, and thereby a larger displacement amount than the elastic limit of the frame 15 can be applied to the points 17 and 18.

Figure 11:
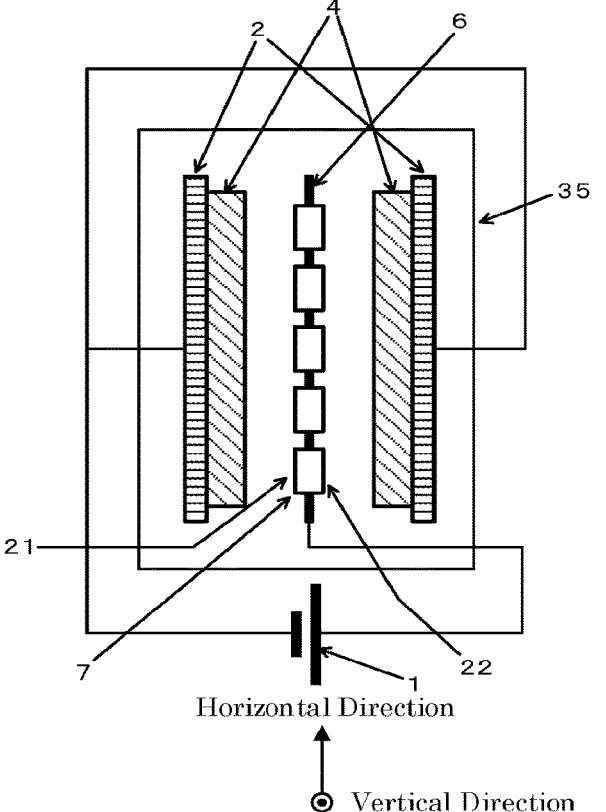
FIG. 11 is a schematic view showing the duplex film forming treatment chamber viewed from the upper side in the vertical direction used in the method for manufacturing a rare earth magnet in the case of the horizontal configuration according to one embodiment of the present invention.
Figure 12:
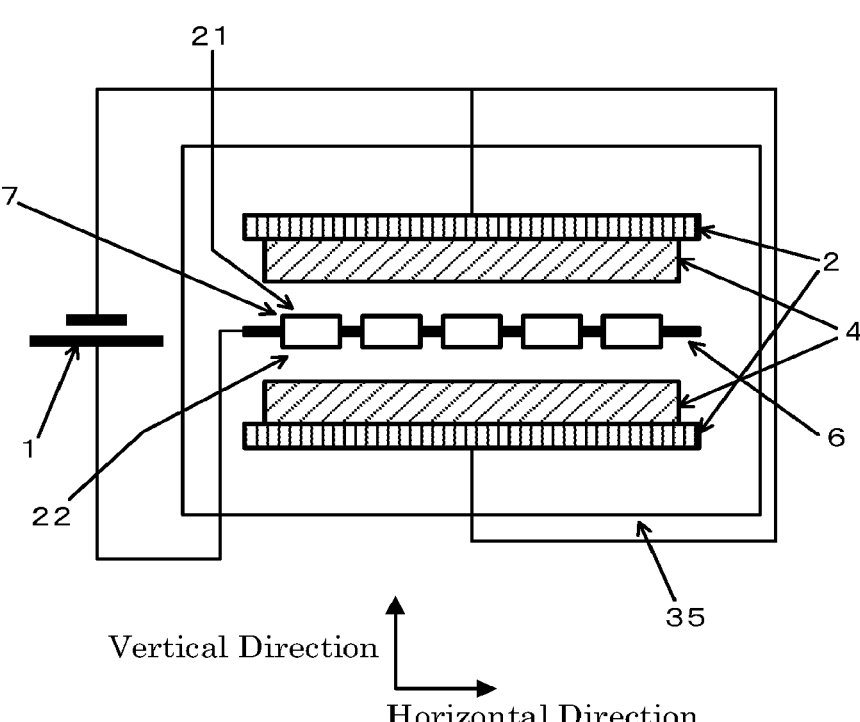
FIG. 12 is a schematic view showing the duplex film forming treatment chamber viewed from the lateral side in the horizontal direction used in the method for manufacturing a rare earth magnet in the case of the vertical configuration according to one embodiment of the present invention.

For enhancing the productivity in the film forming process, it is more preferred that the films are simultaneously formed on both the first surface and the second surface of the sintered article. In this case, the sintered article is used as the anode, and therefore the electric connection is important. Two targets 4 are disposed on both sides of the sintered article supporting jig 6 having the sintered articles 7 disposed therein in the duplex film forming treatment chamber 35, for example, as shown in FIG. 11 for the horizontal configuration, or in FIG. 12 for the vertical configuration. In the case where the films are simultaneously formed on both the surfaces, it is also possible that plural chambers of the duplex film forming treatment chambers 35 are disposed in series, and the films are formed in an inert gas atmosphere without exposing the plural sintered articles to the air, depending on necessity. Furthermore, the duplex film forming treatment chamber 35 may be connected to one chamber or two chambers of the first film forming treatment chamber 5 and the second film forming treatment chamber 25. The duplex film forming treatment chamber 35 has provided therein the target 4 containing $R^2$ disposed on the side of the first surfaces 21 of the plural sintered articles 7 and the target 4 containing $R^2$ disposed on the side of the second surfaces 22 of the plural sintered articles 7. The films are formed on the first surfaces 21 and the second surfaces 22 of the plural sintered articles 7 disposed side by side with the sintered article supporting jig 6 in an inert gas atmosphere in the duplex film forming treatment chamber 35.

At the time of the heat treatment for diffusion described later, the sintered articles having the film formed thereon may be placed in a heat treatment chamber. However, in the case where the sintered articles are simply stacked and placed therein, the surfaces thereof having the film formed thereon may be welded each other in some cases. In the case where the melting point of the diffusion source is lower than the diffusion treatment temperature, the surfaces are completely melted, and the stacked sintered articles are welded each other in the cooling step. Even in the case where the melting point of the diffusion source is higher, a phase having a low melting point is frequently formed as a result of the reaction with the sintered article, and the welding occurs also in this case. For preventing this phenomenon, a jig preventing the sintered articles from being into contact with each other is preferably used in placing in the heat treatment chamber. However, the isolation with the jig decreases the amount of the sintered articles placed in the heat treatment chamber. It is important not to decrease the amount of the sintered articles placed therein, from the standpoint of the productivity.

In this case, for example, a film of a rare earth compound, such as an oxide, a fluoride, or an oxyfluoride of $R^3$ (wherein $R^3$ represents one kind or two or more kinds of an element selected from rare earth elements) is provided on the outermost surface of the sintered article having the film formed thereon. According to the configuration, the welding of the stacked sintered articles in the heat treatment can be prevented. The formation of this film by a sputtering method in a separate step may cause decrease in productivity. Accordingly, it is preferred that the film of the rare earth compound is formed continuously after forming the film of the diffusion source. In this case, a weld suppressing treatment chamber for forming the film of the rare earth compound may be provided adjacent to the treatment chamber for sputtering the diffusion source, and thereby the sintered articles can be continuously treated without decreasing the productivity. The target provided in the weld suppressing treatment chamber is preferably a target containing one kind or two or more kinds of a material selected from the group consisting of a metal of the $R^3$, an alloy of the $R^3$, an oxide of the $R^3$, a fluoride of the W, and an oxyfluoride of the $R^3$ (wherein $R^3$ represents one kind or two or more kinds of an element selected from rare earth elements).

Furthermore, for example, reactive sputtering can be performed by using a target of a metal of $R^3$ or a fluoride of $R^3$ and imparting a partial pressure of oxygen or nitrogen to the atmosphere of the weld suppressing treatment chamber. According to the procedure, an oxide film can be formed with a combination of a metal target and an oxygen atmosphere, a nitride film can be formed with a combination of a metal target and a nitrogen atmosphere, an oxyfluoride film or the like can be formed with a combination of a fluoride target and an oxygen atmosphere, and these films are also highly effective for the weld prevention.

While a thickness of the film of the rare earth compound of 10 nm or more exerts the effect, the thickness thereof is preferably 100 nm or more. The upper limit of the thickness is not particularly determined, and the film may be formed to a thickness of approximately 100 μm, as far as the condition does not deteriorate the productivity. In the case where a target of the rare earth compound having low electroconductivity is used, an RF electric power source is preferably used as the electric power source.

In the case where the film of the rare earth compound is provided, for example, the first weld suppressing treatment chamber for forming the film of the rare earth compound on the first surfaces of the sintered articles and the second weld suppressing treatment chamber for forming the film of the rare earth compound on the second surfaces of the sintered articles may be provided, as similar to the film forming treatments in the first film forming treatment chamber 5 and the second film forming treatment chamber 25 described above. Furthermore, the films of the rare earth compound may be formed on both the first surfaces and the second surfaces of the sintered articles in a weld suppressing treatment chamber having provided therein both a target disposed on the side of the first surfaces of the sintered articles and a target disposed on the side of the second surfaces of the sintered articles, as similar to the film forming treatment in the duplex film forming treatment chamber 35 described above.

The sintered articles frequently tend to be a high temperature through the series of the film forming treatments, and therefore a cooling chamber may be provided after the film forming treatment chamber. In the case where argon gas or the like is used for cooling, a gate valve may be provided between the cooling chamber and the film forming treatment chamber. Furthermore, a delivery chamber for taking out the sintered articles having the film formed thereon is preferably provided at the tail end via a gate valve.

Thereafter, for example, the sintered article taken out from the sintered article supporting jig delivered from the apparatus are placed in the heat treatment chamber and heat-treated in vacuum or in an inert gas atmosphere, such as argon or helium (this treatment is hereinafter referred to as a diffusion treatment). The diffusion treatment temperature is the sintering temperature of the sintered article or lower. The factors restricting the diffusion treatment temperature are as follows. In the case where the heat treatment is performed at a temperature that is higher than the sintering temperature (which is referred to as $T_S°$ C.) of the sintered article, problems occurs, for example, (1) the structure of the sintered article is deteriorated to fail to provide high magnetic characteristics, (2) the processed dimension cannot be retained due to thermal deformation, and (3) $R^2$ thus diffused is excessively diffused not only to the crystal grain boundaries of the sintered article, but also to the interior of the crystal grains, resulting in decrease of the residual magnetic flux density, and therefore the diffusion treatment temperature is the sintering temperature of the sintered article or lower, and preferably $(T_S-10)°$ C. or less. The lower limit of the diffusion treatment temperature may be appropriately determined, and is generally 600° C. or more. The diffusion treatment time may be 1 minute to 100 hours, more preferably 30 minutes to 50 hours, and particularly preferably 1 to 30 hours, from the standpoint of the completion of the sufficient diffusion treatment, and the consideration of the deterioration of the structure of the sintered article and the influence on the magnetic characteristics.

Through the diffusion treatment, $R^2$ is concentrated in the grain boundary component rich in $R^1$ in the sintered article, and $R^2$ substitutes a part of $R^1$ in the vicinity of the surface layer of the $R^1_2Fe_{14}B$ main phase particles. Elements that have a particularly large effect of enhancing the crystal magnetic anisotropy through the concentrating in the surface layer are Tb and Dy. Accordingly, the total proportion of Tb and/or Dy in the rare earth element $R^2$ contained in the diffusion source is preferably 50% by atom or more, and more preferably 80% or more. In the case where $R^2$ contained in the diffusion source contains one kind or two kinds of element of Pr and Nd, the total concentration of Pr and Nd in $R^2$ contained in the diffusion source is preferably smaller than the total concentration of Pr and Nd in the rare earth element $R^1$ contained in the base material. As a result of the diffusion treatment, the coercive force of the $R^1$—Fe—B based sintered magnet can be efficiently enhanced associated with substantially no decrease of the residual magnetic flux density.

In the case where the $R^2$-M alloy film or the multilayer film of $R^2$ and M is formed on the surface of the sintered article, an $R^2$—Fe-M phase may also be formed in the grain boundary phase through the diffusion treatment described above. According to the procedure, the coercive force of the $R^1$—Fe—B based sintered magnet can be further enhanced.

After the diffusion treatment, a heat treatment at a low temperature (which is hereinafter referred to as an aging treatment) is preferably performed. The treatment temperature of the aging treatment is desirably less than the diffusion treatment temperature, preferably a temperature that is 200° C. or more and lower than the diffusion treatment temperature by 10° C., and more preferably a temperature that is 350° C. or more and lower than the diffusion treatment temperature by 10° C. The atmosphere of the aging treatment is preferably vacuum or an inert gas, such as argon or helium. The treatment time of the aging treatment may be 1 minute to 10 hours, preferably 10 minutes to 5 hours, and particularly preferably 30 minutes to 2 hours.

In the case where in the grinding process described above before the diffusion treatment, an aqueous coolant is used for the grinding machine, or the ground surface is exposed to a high temperature in grinding, an oxide film is readily formed on the ground surface. In the case where the oxide film is light, a clean surface can be obtained before the diffusion treatment through the baking treatment or the reverse sputtering treatment described above performed before the film formation by the sputtering method. However, in the case where an excessively heavy oxide film is formed on the surface of the sintered article, the oxide film may hinder the diffusion of $R^2$ to the sintered article. In this case, the oxide film may be removed by cleaning with one kind or two or more kinds of compounds of an alkali, an acid, and an organic solvent, or by performing shotblasting, and thereby the subsequent diffusion treatment can be properly performed.

Examples of the alkali used for removing the oxide film include potassium pyrophosphate, sodium pyrophosphate, potassium citrate, sodium citrate, potassium acetate, sodium acetate, potassium oxalate, and sodium oxalate. Examples of the acid used for removing the oxide film include hydrochloric acid, nitric acid, sulfuric acid, acetic acid, citric acid, and tartaric acid. Examples of the organic solvent used for removing the oxide film include acetone, methanol, ethanol, and isopropyl alcohol. In this case, the alkali and the acid may be used in the form of an aqueous solution having a concentration that does not corrode the sintered article.

The sintered article having been subjected to the diffusion treatment or the aging treatment subsequent thereto may be cleaned with one kind or two or more kinds of a compound of an alkali, an acid, and an organic solvent, and may be ground into a practical shape. Furthermore, the sintered article may be plated or painted after the diffusion treatment, the aging treatment, cleaning, or grinding.

The method for manufacturing a rare earth magnet according to one embodiment of the present invention has been described with reference to the film forming treatment chambers 5, 25, and 35 as examples. However, the film forming apparatus used in the method for manufacturing a rare earth magnet of the present invention is not limited to the film forming treatment chambers 5, 25, and 35, as far as the method for manufacturing a rare earth magnet of the present invention can be practiced.

The rare earth magnet obtained in the aforementioned manner can be used as a high-performance permanent magnet having an increased coercive force.

REFERENCE SIGN LIST

1: electric power source
2: cathode
3: anode
4: target
5, 25, 35: film forming treatment chamber
6: sintered article supporting jig
7: sintered article
15: beam of holding part
16: lateral frame
17, 18: point of holding part
21: first surface
22: second surface

The invention claimed is:

1. A method for manufacturing a rare earth magnet, comprising a grain boundary diffusion process, the method comprising:

forming at least one kind of a film selected from an $R^2$ film, an $R^2$-M alloy film, and a multilayer film of $R^2$ and M by a physical vapor phase deposition method, on plural sintered articles each having a first surface and a second surface on an opposite side to the first surface, each comprising an $R^1$—Fe—B based composition; and then allowing $R^2$ or $R^2$ and M to be absorbed by the sintered articles through a heat treatment, wherein:

the plural sintered articles are disposed side by side with a jig in such a manner that the first surfaces of the plural sintered articles are along a plane in parallel to a vertical direction or a horizontal direction, $R^2$ represents at least one kind of an element selected from rare earth elements, and is required to be one kind or two kinds of Tb and Dy, M represents at least one kind of an element selected from the group consisting of Cu, Al, Co, Fe, Mn, Ni, Sn, and Si, and $R^1$ represents at least one kind of an element selected from rare earth elements, and is required to be one kind or two kinds of Pr and Nd, the grain boundary diffusion process comprises:

a first forming of the film on the first surface of the plural sintered articles disposed side by side with the jig in an inert gas atmosphere, in a first film forming treatment chamber having provided therein a target containing $R^2$ provided by disposing on a side of the first surfaces of the plural sintered articles;

a second forming of the film on the second surface of the plural sintered articles disposed side by side with the jig in an inert gas atmosphere, without reversing the plural sintered articles, in a second film forming treatment chamber, which is juxtaposed with the first film forming treatment chamber, having provided therein a target containing $R^2$ provided by disposing on a side of the second surfaces of the plural sintered articles; and a moving of the plural sintered articles disposed side by side with the jig in a horizontal direction or a vertical direction between the first film forming treatment chamber and the second film forming treatment chamber, the jig contains at least one kind of a material selected from the group consisting of aluminum, an aluminum alloy, copper, a copper alloy, iron, an iron alloy, titanium, a titanium alloy, niobium, a niobium alloy, tungsten, a tungsten alloy, molybdenum, and a molybdenum alloy;

the jig has a holding part formed to have points, between which the sintered article is held;

the jig contains plural lateral frames;

the sintered article is disposed between the adjacent lateral frames;

the holding part comprises a beam;

the beam is elastically deformed in such a manner that one point of the points is moved upward, whereas the other point of the points is moved downward, with the lateral frame as the center;

the lateral frames can be elastically deformed; and the points of the holding part each have a moving distance within elastic limit that is twice or more a dimensional tolerance range of a dimension of the sintered article in a holding direction.

2. The method for manufacturing a rare earth magnet according to claim 1, wherein the plural first film forming treatment chambers and the plural second film forming treatment chambers each are disposed in series, and the film is continuously formed in an inert gas atmosphere without exposing the plural sintered articles to the air.

3. A method for manufacturing a rare earth magnet, comprising a grain boundary diffusion process, the method comprising:

forming at least one kind of a film selected from an $R^2$ film, an $R^2$-M alloy film, and a multilayer film of $R^2$ and M by a physical vapor phase deposition method, on plural sintered articles each having a first surface and a second surface on an opposite side to the first surface, each containing an $R^1$—Fe—B based composition; and then allowing $R^2$ or $R^2$ and M to be absorbed by the sintered articles through a heat treatment, wherein:

the plural sintered articles are disposed side by side with a jig in such a manner that the first surfaces of the plural sintered articles are along a plane in parallel to a vertical direction or a horizontal direction, $R^2$ represents at least one kind of an element selected from rare earth elements, and is required to be one kind or two kinds of Tb and Dy, M represents at least one kind of an element selected from the group consisting of Cu, Al, Co, Fe, Mn, Ni, Sn, and Si, and $R^1$ represents at least one kind of an element selected from rare earth elements, and is required to be one kind or two kinds of Pr and Nd, the grain boundary diffusion process comprises:

forming the film simultaneously on the first surface and the second surface of the plural sintered articles disposed side by side with the jig in an inert gas atmosphere, in a duplex film forming treatment chamber having provided therein a target containing $R^2$ provided by disposing on a side of the first surfaces of the plural sintered articles and a target containing $R^2$ provided by disposing on a side of the second surfaces of the plural sintered articles, the jig contains at least one kind of a material selected from the group consisting of aluminum, an aluminum alloy, copper, a copper alloy, iron, an iron alloy, titanium, a titanium alloy, niobium, a niobium alloy, tungsten, a tungsten alloy, molybdenum, and a molybdenum alloy;

the jig has a holding part formed to have points, between which the sintered article is held;

the jig contains plural lateral frames;

the sintered article is disposed between the adjacent lateral frames;

the holding part comprises a beam;

the beam is elastically deformed in such a manner that one point of the points is moved upward, whereas the other point of the points is moved downward, with the lateral frame as the center;

the lateral frames can be elastically deformed; and the points of the holding part each have a moving distance within elastic limit that is twice or more a dimensional tolerance range of a dimension of the sintered article in a holding direction.

4. The method for manufacturing a rare earth magnet according to claim 3, wherein plural duplex film forming treatment chambers are disposed in series, and the film is continuously formed in an inert gas atmosphere without exposing the plural sintered articles to the air.

5. The method for manufacturing a rare earth magnet according to claim 1, wherein the holding part is coated with at least one kind of a material selected from an organic material and ceramics, except for a contact point to the sintered article and an electric connecting point for grounding.

6. The method for manufacturing a rare earth magnet according to claim 1, wherein the grain boundary diffusion process comprises at least one selected from the group consisting of:

vacuuming an atmosphere of the plural sintered articles in a preparation chamber, before placing the plural sintered articles in the film forming treatment chamber;

eliminating an adsorbed gas from the plural sintered articles in a baking treatment chamber, before placing the plural sintered articles in the film forming treatment chamber;

cleaning the surfaces of the plural sintered articles in a reverse sputtering chamber, before placing the plural sintered articles in the film forming treatment chamber;

heat-treating the plural sintered articles in a heat treatment chamber, after forming the film on the surfaces of the plural sintered articles;

cooling the plural sintered articles in a cooling chamber after the heat treatment; and an air release of allowing an atmosphere of the plural sintered articles to be an atmospheric pressure, for releasing the plural sintered articles to air in a delivery chamber, wherein the film forming treatment chamber is continuously connected to one or two or more of a chamber selected from the group consisting of the preparation chamber, the baking treatment chamber, the heat treatment chamber, the cooling chamber, and the delivery chamber.

7. The method for manufacturing a rare earth magnet according to claim 1, wherein the grain boundary diffusion process further comprises, after forming the film and before the heat treatment, a weld suppressing of forming a film of at least one kind of a compound selected from an oxide, a fluoride, and a oxyfluoride of $R^3$ by a physical vapor phase deposition method, on one surface or both surfaces of the first surface and the second surface of the plural sintered articles disposed side by side with the jig, the weld suppressing forming a film of the compound on one surface or both surfaces of the first surface and the second surface of the plural sintered articles disposed side by side with the jig in at least one kind of a gas atmosphere selected from the group consisting of argon, oxygen, and nitrogen, in a weld suppressing treatment chamber having provided therein one target or both targets of a target containing at least one kind of a material selected from the group consisting of a metal of the $R^3$, an alloy of the $R^3$, an oxide of the $R^3$, a fluoride of the $R^3$, and an oxyfluoride of the $R^3$, disposed on a side of the first surfaces of the plural sintered articles, and a target containing at least one kind of a material selected from the group consisting of a metal of the $R^3$, an alloy of the $R^3$, an oxide of the $R^3$, a fluoride of the $R^3$, and an oxyfluoride of the $R^3$, disposed on a side of the second surfaces of the plural sintered articles, and $R^3$ represents one kind or two or more kinds of an element selected from rare earth elements.

8. The method for manufacturing a rare earth magnet according to claim 7, wherein the weld suppressing comprises a first weld suppressing of forming a film of the compound by a physical vapor phase deposition method, on the first surface of the plural sintered articles disposed side by side with the jig, in a first weld suppressing treatment chamber having provided therein the target disposed on a side of the first surfaces of the plural sintered articles, and a second weld suppressing of forming a film of the compound by a physical vapor phase deposition method, on the second surface of the plural sintered articles disposed side by side with the jig, in a second weld suppressing treatment chamber having provided therein the target disposed on a side of the second surfaces of the plural sintered articles.

9. The method for manufacturing a rare earth magnet according to claim 7, wherein the weld suppressing comprises forming a film of the compound by a physical vapor phase deposition method, simultaneously on the first surface and the second surface of the plural sintered articles disposed side by side with the jig, in a duplex weld suppressing treatment chamber having provided therein the target disposed on a side of the first surfaces of the plural sintered articles and the target disposed on a side of the second surfaces of the plural sintered articles.

10. The method for manufacturing a rare earth magnet according to claim 1, wherein the physical vapor phase deposition method is a sputtering method.

11. The method for manufacturing a rare earth magnet according to claim 7, wherein the physical vapor phase deposition method in the weld suppressing is an RF sputtering method.

* * * * *